(12) United States Patent
Kuitenbrouwer et al.

(10) Patent No.: US 6,542,375 B1
(45) Date of Patent: Apr. 1, 2003

(54) HYBRID PCB-IC DIRECTIONAL COUPLER

(75) Inventors: Tibor Kuitenbrouwer, Amsterdam (NL); Martin Middlehoek, Rijswijk (NL); Michael Kouwenhoven, Zoetermeer (NL); Errol Dietz, Morgan Hill, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 09/881,907

(22) Filed: Jun. 14, 2001

(51) Int. Cl.[7] ................................................ H05K 1/18
(52) U.S. Cl. ....................... 361/764; 361/816; 361/818; 361/764; 174/35; 174/510 R; 257/778
(58) Field of Search ..................... 361/800, 762, 361/764, 767, 777, 779, 803, 674, 718, 719, 743, 750, 820; 257/698, 713, 778; 174/35, 51 R

(56) References Cited

U.S. PATENT DOCUMENTS 5,783,867 A * 7/1998 Belke et al. ................ 257/782
5,977,631 A * 11/1999 Notani ........................ 257/664
6,145,191 A * 11/2000 Baldwin ..................... 228/103
6,177,806 B1 * 1/2001 Burghartz ............... 324/117 H

* cited by examiner

*Primary Examiner*—Randy W. Gibson
*Assistant Examiner*—Hung Bui
(74) *Attorney, Agent, or Firm*—Wagner, Murabito & Hao LLP

(57) ABSTRACT

The present invention relates to a method for providing non-contact power/current sensing in an electronic circuit. Specifically, the method provides an electronic coupler in the form of an integrated circuit microstrip mounted in close proximity to a current-carrying microstrip on a printed circuit board. The integrated circuit is mounted on and electronically coupled to electronic components of said printed circuit board with the microstrip on the printed circuit board side of the integrated circuit substrate, and the integrated circuit microstrip is positioned in such a way as to effect electromagnetic coupling to an electronic microstrip on the printed circuit board.

20 Claims, 4 Drawing Sheets

HYBRID PCB-IC DIRECTIONAL COUPLER

FIELD OF THE INVENTION

The present invention relates to the field of signal coupling in integrated circuits and printed circuit boards.

BACKGROUND OF THE INVENTION

Modern electronic devices have gotten steadily smaller with advances in Integrated Circuit (IC) design and advances in packaging. More and more functions have been pressed into smaller and smaller appliances. This phenomenon is most apparent in the realm of portable telephones.

In many electronic devices, and especially in those such as portable phones that require analog power amplification, there are occasions in which one circuit requires an indication or quantification of a signal or current flow in a different circuit. While there are times the two circuits are incompatible and incapable of direct connection, a more important consideration is that the sensing circuit not degrade or otherwise influence the signal being sensed.

There are devices in existence which provide the transfer of current or frequency information between circuits, specifically between conductors, without a direct connection being required. Optical couplers, for example, utilize a combination LED/photocell to non-electrically transfer information between circuits. Optical coupling, however, requires additional components: the LED and photocell and their supporting circuitry with their attendant complexity and size. Inductive couplers also do not require a direct connection but lack the ability to sense current direction.

Electromagnetic coupling, where a current fluctuation in a transmission line causes an analogous current fluctuation in an adjacent line, has both inductive and capacitive components. It can be used to transfer information between two circuits without a direct connection. However, typical electromagnetic coupling requires either very large currents in the "sending" conductor in order to provide a readable signal in a "receiving" conductor or very close proximity of the "sender" and "receiver". While electromagnetic coupling provides current, frequency and direction information, achieving the proximities required to employ electromagnetic coupling in low power circuits has been somewhat impractical. Additionally, even at relatively low currents, high RF frequencies radiate electromagnetic fields (EMFs) that induce signals in areas where they are not desirable and receiving conductors must be very sensitive to correctly read the emitted EMF. To counteract that, a coupler must be properly shielded.

One means used to form a coupler is to position two transmission lines and associated dielectric layers in a single IC. This requires a complex, specially fabricated, IC that limits the application of the coupling and also requires the transfer of the relatively high power, high frequency, sending current from the printed circuit board (PCB) onto the IC. The limited vertical dimensions available on a typical IC also limits the range of achievable impedances, further limiting the sensitivity and application of integrated couplers.

Another means is by building a difficult-to-manufacture sandwich of conductors, dielectrics and shielding groundplanes, and installing the assembly on a PCB. This method, though effective at coupling, entails the additional disadvantage of using up a large amount of valuable PCB space.

What is needed, then, is a means of reliably employing directionally sensing electromagnetic coupling in low power circuits in a small package. Furthermore, such a means must minimize the number of devices that must handle large currents and must minimize additional complexity and cost.

SUMMARY OF THE INVENTION

Presented herein is a means of reliably employing directionally sensing electromagnetic coupling in low power circuits in a small package. The means provides minimal additional complexity and cost and yet provides the advantages of not requiring a transfer of a large current and/or high frequency signals to a chip and of using a miniscule amount of PCB real estate.

The present invention relates to a method for providing non-contact power/current sensing in an electronic circuit. Specifically, the method provides an electronic coupler in the form of an integrated circuit microstrip mounted in close proximity to a current-carrying microstrip on a printed circuit board. The integrated circuit is mounted on and electronically coupled to electronic components of said printed circuit board with the microstrip on the printed circuit board side of the integrated circuit substrate, and the integrated circuit microstrip is positioned in such a way as to effect electromagnetic coupling to an electronic trace on the printed circuit board.

Embodiments of the present invention disclose a method for providing an electronic coupler which comprises a printed circuit board and an integrated circuit which is mounted on and electronically coupled to electronic components on the printed circuit board. The integrated circuit is positioned in such a way as that it electromagnetically couples to an electronic trace on the printed circuit board.

BRIEF DESCRIPTION OF THE DRAWINGS

The operation of this invention can be best visualized by reference to the drawings.

SPECIFICATION

Figure 1:
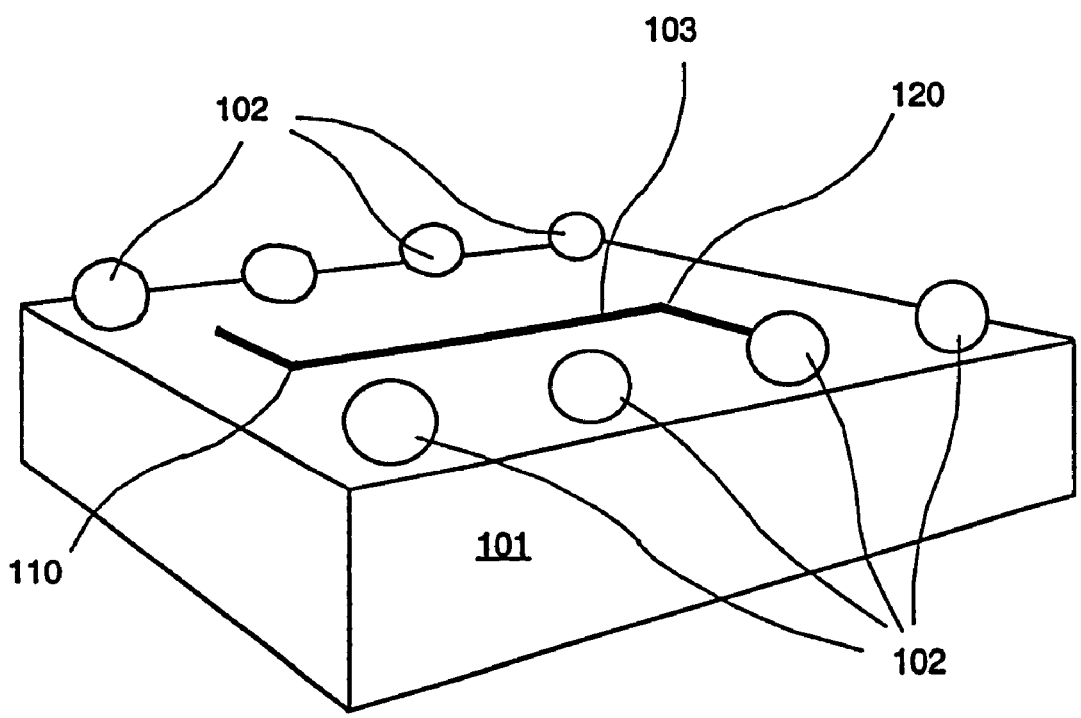
FIG. 1 illustrates an integrated circuit with a microstrip in a Ball Grid Array (BGA) package consistent with embodiments of the present invention.

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well-known methods, procedures, components, and circuits have not been described in detail so as not to unnecessarily obscure aspects of the present invention.

Some portions of the detailed descriptions that follow are presented in terms of procedures, logic blocks, processing, and other symbolic representations of operations on signals within an electronic circuit. These descriptions and representations are the means used by those skilled in the electronic arts to most effectively convey the substance of their work to others skilled in the art. A procedure, logic block, process, etc., is here, and generally, conceived to be a self-consistent sequence of steps or instructions leading to a desired result. The steps are those requiring physical manipulations of physical quantities. Usually, though not necessarily, these quantities take the form of electrical or magnetic signals capable of being stored, transferred, combined, compared, and otherwise manipulated in an electronic system.

DETAILED DESCRIPTION

There are many conceivable embodiments of the present invention. However, the concepts underlying the present invention may be best understood by the discussion of only a few embodiments. This discussion in no way limits the application of the concepts nor determines the limit to embodiments possible.

In this discussion, reference will be made to prior art in the form of existing patents. U.S. Pat. No. 5,032,803 to Koch and U.S. Pat. No. 5,521,563 to Mazzochotte are incorporated herein by reference.

One envisioned embodiment of the present invention presents a directional power measurement device. This device benefits from the combination of advances in IC, PCB and IC packaging technology and results in a power sense IC for some types of mobile phones. This embodiment of the present invention is, however, applicable to many RF applications and is not limited to mobile phone applications.

This embodiment of the present invention is implemented as the combination of a PCB-microstrip, on an insulating substrate with a grounded backplane, and an IC-microstrip on a typical IC substrate which can be conductive and "lossy". A directional coupler is realized through placement of the IC on top of the PCB microstrip, using an available IC package, such that the IC microstrip is lined up with and positioned directly above the PCB microstrip.

The necessary electromagnetic coupling between the two lines is achieved by providing the "receiving" IC microstripline between the "sending" PCB trace and the IC's conductive substrate. It is important to emphasize that the IC's Silicon (Si) substrate is outside the proximal pairing of microstrips, providing a shielding "sandwich" for the PCB trace and the IC microstripline. The substrate in this fashion provides shielding to the coupler. However, a silicon substrate also introduces losses, reducing somewhat the EM coupling between microstrips.

By implementation in the combination, the need found in other types of couplers for a relatively large number of traces to a high-power signal is reduced. Other types of couplers require galvanic (conducting) connections to high-power signals, whereas this embodiment of the present invention requires none. Another advantage to this implementation is the integration of coupler functionality and required detection electronics on a single IC, thereby eliminating the need for a separate discrete coupler component. Still another advantage is the avoidance of the difficult transfer of generally high-power, high-frequency, signals travelling through the primary PCB microstrip on and off the chip (IC).

The peculiar properties of PCB "microstrip" lines lend themselves well to the embodiment of the present invention discussed here. A microstrip is a specially constructed transmission line, consisting of the combination of a metal conductive trace, a dielectric and a conductive, usually metal, groundplane. When used in combination with the properties of an IC microstrip line, a peculiarly successful coupling can be attained.

In this embodiment of the present invention, an IC microstrip line is mounted in very close, non-contact, proximity to a PCB microstrip line. There are many applications in which a PCB microstrip line suitable to the concept discussed here is employed. However, one particularly apt application is in an RF power amplifier. A PCB microstrip employed with an RF power amplifier is likely to carry high power, high frequency signals.

In most applications of RF power amplifiers, an antenna is connected to the power amplifier by a transmission line. Typically, the line's impedance is a standard, chosen equal to 50Ω. A microstrip of such a predictable impedance is a very easy to manufacture structure. The impedance is dependent on the dielectric constant of the PCB substrate material and the geometrical ratio of the conducting trace width and the thickness of the isolator and is easily calculated during design.

In one implementation of this embodiment of the present invention, a trace width of 1 mm and FR4 PCB substrate material, with dielectric constant of 4.7 and height of 0.51 mm, are selected as being representative of industry standards. This selection produces a stripline of a nominal 50Ω, a very common resultant value. At the frequencies of interest, those used in modern mobile phones around 900 MHz and around 1.7 GHz, this impedance results in an EM field suitably sensed by a properly positioned IC microstrip.

A microstrip on an IC, while similar to a PCB microstrip, has some subtle differences. Like its PCB counterpart, the transmission line component is usually in an upper metal layer. However, the dielectric isolator is typically Si or $SiO_2$ and the conductive groundplane is usually the IC substrate. Note that the dielectric constant of $SiO_2$ is approximately equal to 4; the dielectric constant of Si is approximately 12. Experimentation has shown that, taking into account the influence of the PCB groundplane and the IC substrate, an excellent impedance matching and coupling can be attained by employing a microstripline on the IC that is approximately 200 $\mu$m (micron) in width, 1.3 $\mu$m thick and 3 mm long between perpendicular attachments. A suitable positioning is approximately 110 $\mu$m–140 $\mu$m above the PCB microstrip and parallel to it.

When power sense amplifiers are designed on chip, the value of the characteristic line impedance can be tailored for a proper match in the application. This provides an extra design-in variable for the design of the PCB-IC coupler.

In order to realize a directional coupler, it is especially important to note that the IC microstrip trace is placed upside down (between the PCB and the IC substrate) over the much wider PCB trace with the centerlines of the traces parallel. This places the active portions of the IC between the IC substrate and the PCB. When the IC is placed in a micro-sized ball grid array package on top of the PCB microstrip, the IC-microstrip trace is located at a fixed distance from the PCB trace. The distance between the two traces is equal to the height of the solder bumps attendant to the typical BGA package, in the vicinity of 110 $\mu$m–140 $\mu$m.

The arrangement of the IC/PCB juxtaposition in this embodiment of the present invention is most easily seen by reference to the drawings, FIGS. 1–4. In FIG. 1, a common form of micro-sized ball grid array (BGA) package is illustrated. In the particular form of BGA package shown, the IC chip is itself implemented as the package, avoiding an additional series of manufacturing steps requisite in packaging the IC in a larger footprint device. In this implementation, the silicon substrate, 101, provides the package body as shown. The IC stripline referred to in this discussion of this embodiment of the present invention is shown at 103. The tiny solder balls, or dots, which give the device its generic name are shown at 102. The solder balls are, in IC manufacture, attached to suitably sized pads on the IC. One standard spacing of solder balls in a BGA is 0.5 mm on center.

When a BGA device is mounted to a PCB, the solder balls become solder bumps, providing both mechanical and electrical connection between the IC device and the board. Standard manufacturing processes result in a mounting separation, shown in FIG. 2 as "d" at 210, of 110 $\mu$m–140 $\mu$m. The IC microstripline design in one embodiment of the present invention is optimized for this separation between IC trace and PCB trace. It is noted that there are many other combinations of trace sizes and separations that could employ the concepts presented here but this particular embodiment showed excellent results in experimentation.

The IC microstripline, 103 in FIG. 1, is attached with two perpendicular attachments at each end at 110 and 120. In this implementation, it was found that the perpendicular attachment reduced the influence of the PCB trace EMF on the IC microstrip. However, the perpendicular connections are not necessary to the concepts present in this embodiment. In experimentation, a length of IC microstrip of 3 mm between the two perpendicular attachments was found to be optimal for this implementation. It is important to note here that direct attachment of the IC microstrip connections to the solder ball pads is not necessary, or even desirable, to this embodiment of the present invention. It is quite possible that all signal sensing would take place entirely on-chip with only informational logic being sent to some other device. Indeed, a primary advantage of this embodiment is the obviation of a need to transfer high-frequency signals on and off of an IC via galvanic (conductive) connections.

Figure 2:
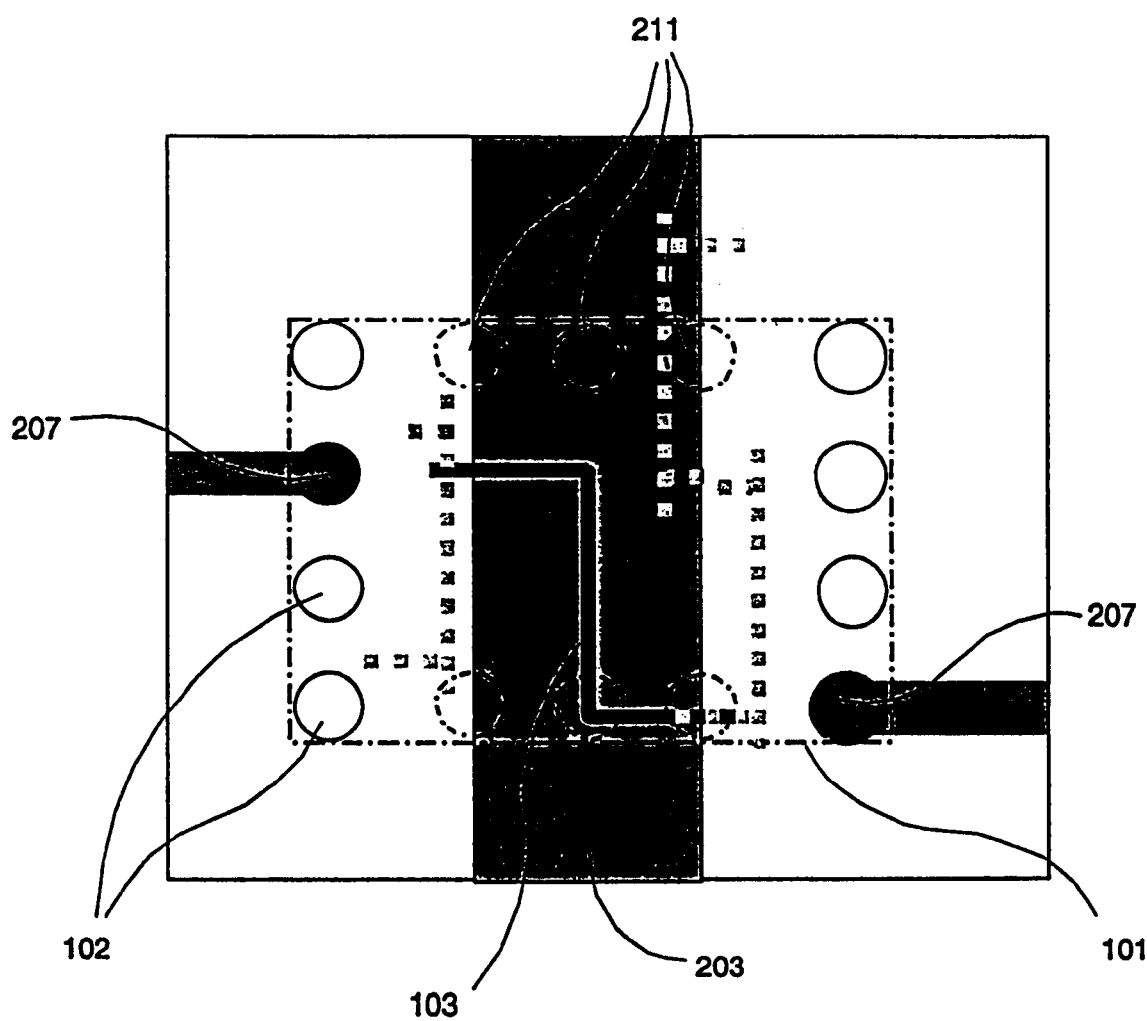
FIG. 2 Illustrates a top view of an arrangement of an integrated circuit microstrip juxtaposed with a printed circuit board trace in accordance with the present invention.

FIG. 2 illustrates the placement of a detection IC in a micro-sized BGA package, 101, over a trace on a PCB. IC microstripline 103 is parallel to, centered on and directly over trace 203. Since standard BGA ball spacing would put solder balls on the trace, unused ball positions 211 are illustrated in phantom line. Those unused ball sites could be avoided by manufacturing a package using this implementation without balls in those sites. Solder balls that are used, 102, for attachment and connection are shown as are some of the PCB's solder pads 207. An additional ground plane can also be employed at 207, and connected to PCB groundplane 202, where pads 207 are not connected to circuitry. It is important to note that an approximately equal number of balls are employed on either side of the trace in order to ensure a constant distance between trace 203 and microstrip 103.

Figure 3:
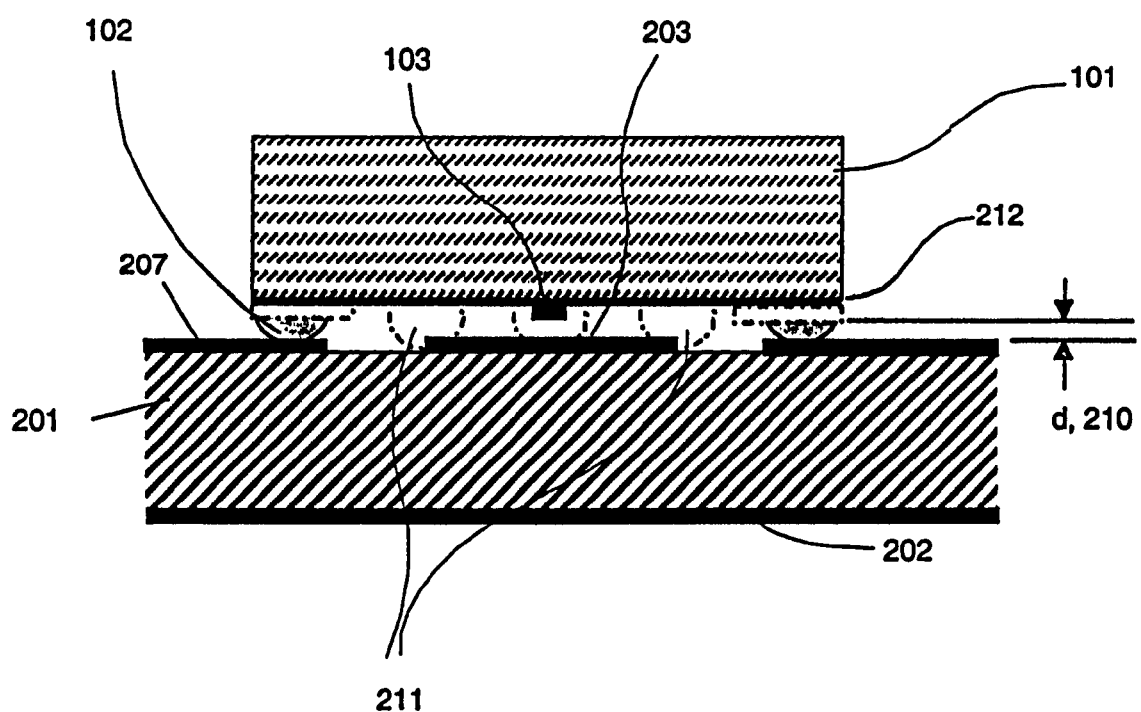
FIG. 3 illustrates an edge-on view of an arrangement of an integrated circuit microstrip juxtaposed with a printed circuit board trace in accordance with the present invention.

FIG. 3 further illustrates this embodiment of the present invention by showing the presence of PCB groundplane 202. While other possible embodiments may not require the presence of groundplane 202, excellent results were had in experimentation when a conductive groundplane was in place on PCB substrate 201.

In FIG. 3, it can be further seen that the distance between the IC trace and the IC groundplane (substrate 101), in this implementation on the order of 0.6 $\mu$m, shown in FIG. 3 as the thickness of IC dielectric 212, is much smaller than the distance between the IC-trace and the PCB trace, which is on the order of 110–140 $\mu$m. Dielectric 212 is likely to be an oxide of silicon ($Si_xO_y$). This implies that the coupling between the two traces is very small. The electromagnetic coupling between the IC-trace and the PCB-trace is necessarily reduced due to the closeness of the IC ground plane. The distance from the PCB-trace to the PCB groundplane is generally larger than the distance from the PCB-trace to the IC-trace. It has been found to be necessary, that in order to improve the coupling, the influence of the IC groundplane/substrate should be reduced.

Figure 4:
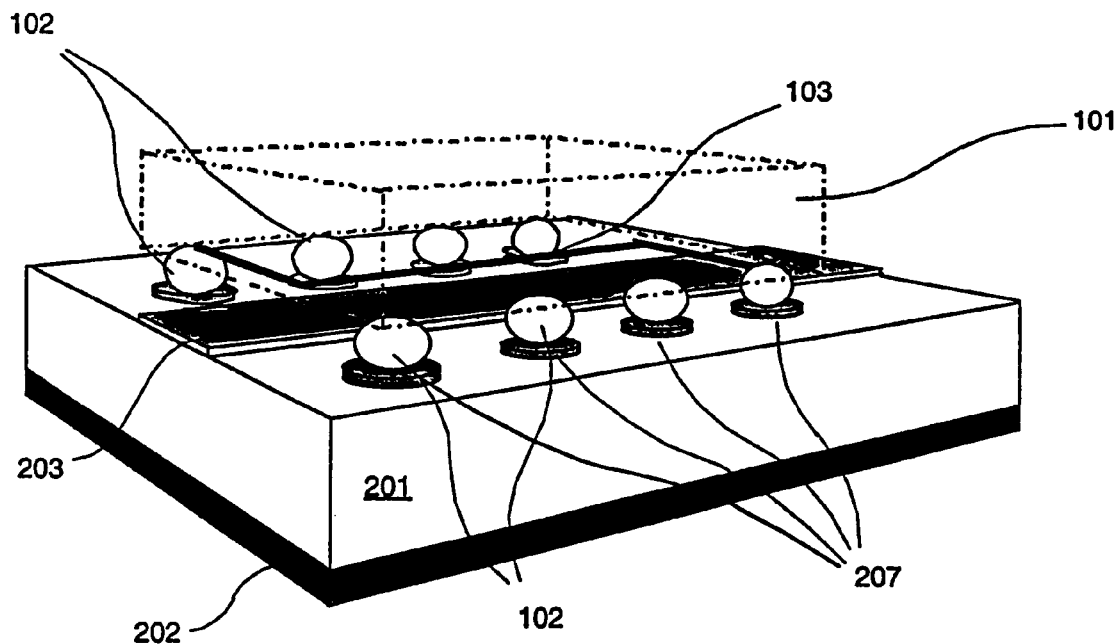
FIG. 4 illustrates another view of an arrangement of an integrated circuit microstrip juxtaposed with a printed circuit board trace in accordance with the present invention.

FIG. 4 is a spatial illustration of the placement of the detection IC over the PCB trace consistent with this embodiment of the present invention. The symmetric arrangement of solder balls 102 on either side of the PCB trace 203 is more clearly shown here.

Experimentation with a directional power detection device consistent with this embodiment of the present invention has demonstrated both good coupling and good isolation from other components. In one implementation, coupling on the order of 18 dB and isolation on the order of 30 dB were achieved at 1.8 GHz with the implementation described above.

Thus, in this embodiment of the present invention, a very simple yet extremely effective directional power detection device has been described. In the manner discussed, a simple and very small footprint device presented that avoids a number of the disadvantages of prior implementations of on-board detection circuits.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

What is claimed is:

1. An electronic coupler, comprising:
    a dielectric printed circuit board substrate;
    an electrically conductive trace attached to said printed circuit board dielectric; and
    an integrated circuit, mounted on and electronically coupled to electronic
    components of said printed circuit board, wherein:
        said integrated circuit is positioned in proximity to said electrically conductive trace in such a way as to electromagnetically couple to a signal in said electrically conductive trace on said printed circuit board and wherein said electrically conductive trace is enabled to carry signals oscillating at RF frequencies.

2. The electronic coupler described in claim 1, wherein said printed circuit board further comprises a conductive groundplane bonded to said printed circuit board dielectric substrate.

3. The electronic coupler described in claim 1, wherein said integrated circuit comprises:
    a semiconductor substrate;
    a conductive trace attached to said semiconductor substrate; and,
    one or more mounting elements on said integrated circuit, wherein:
        said mounting elements are attached to said integrated circuit in a fashion to enable the mounting of said integrated circuit on said printed circuit board so as to form an electromagnetically coupled pairing between said electrically conductive trace attached to said printed circuit board and said integrated circuit trace.

4. The electronic coupler described in claim 3, wherein said mounting elements of said integrated circuit provide both mechanical and electronic coupling between said printed circuit board and said integrated circuit.

5. The electronic coupler described in claim 3, wherein said integrated circuit microstrip is adapted to sense direction and power of current carried in said printed circuit board trace.

6. A method for detecting power in a conductor, comprising the steps of:
provide a conductor in which is carried an electrical signal;
sensing said electrical signal in said conductor by a non-contact coupler; and,
providing said sensed signal at an output wherein said signal in said conductor is an RF signal.

7. The method described in claim 6, wherein said step of providing said signal in a conductor is accomplished in a microstrip on a printed circuit board.

8. The method described in claim 6, wherein said step of sensing said signal in a conductor is accomplished by electromagnetic coupling.

9. The method described in claim 6, wherein said step of sensing said signal in a conductor is accomplished in a trace in an integrated circuit.

10. A device for detecting power in a conductor, comprising:
an integrated circuit substrate;
an electronic circuit integrated in said integrated circuit substrate, wherein said electronic circuit comprises a trace; and,
one or more mounting elements mechanically coupled to said integrated circuit substrate, wherein said integrated circuit trace is arranged to sense an electromagnetic field and wherein said electromagnetic field oscillates at an RF frequency.

11. The device described in claim 10, wherein said integrated circuit is mounted on a printed circuit board.

12. The device described in claim 10, wherein said electromagnetic field emanates from a trace in a printed circuit board.

13. The device described in claim 12, wherein said trace in said printed circuit board is a microstrip.

14. The device described in claim 10, wherein said integrated circuit is mounted on a printed circuit board so as to align parallel with and in close proximity to a trace on said printed circuit board.

15. The device described in claim 10, wherein said integrated circuit is mounted on a printed circuit board so as to present said integrated circuit trace on the surface of the integrated circuit substrate closest to the printed circuit board.

16. The device described in claim 10, wherein said integrated circuit substrate is its own packaging device.

17. The device described in claim 10, wherein said mounting elements are solder balls in a Ball Grid Array device.

18. The device described in claim 10, wherein said integrated circuit further comprises detection circuitry.

19. The device described in claim 10, wherein said integrated circuit further comprises signal processing circuitry.

20. The device described in claim 10, wherein said device is enabled to sense power and direction of signals in said conductor.

* * * * *